United States Patent [19]
Yokota

[11] Patent Number: 5,866,923
[45] Date of Patent: Feb. 2, 1999

[54] SEMICONDUCTOR INTEGRATED CIRCUIT DEVICE HAVING FUNDAMENTAL CELLS AND METHOD OF MANUFACTURING THE SEMICONDUCTOR INTEGRATED CIRCUIT DEVICE USING THE FUNDAMENTAL CELLS

[75] Inventor: Noboru Yokota, Kanagawa, Japan

[73] Assignee: Fujitsu Limited, Kawasaki, Japan

[21] Appl. No.: 694,521

[22] Filed: Aug. 9, 1996

[30] Foreign Application Priority Data

Nov. 8, 1995 [JP] Japan .................................. 7-289516

[51] Int. Cl.⁶ .................................................. H01L 27/10
[52] U.S. Cl. ............................................ 257/204; 257/211
[58] Field of Search .................................. 257/204, 208, 257/210, 211

[56] References Cited

FOREIGN PATENT DOCUMENTS 2-86167  3/1990  Japan .

*Primary Examiner*—Mark V. Prenty
*Attorney, Agent, or Firm*—Armstrong, Westerman, Hattori, McLeland & Naughton

[57] ABSTRACT

A semiconductor integrated circuit having a plurality of fundamental cells respectively composed of a pair of p-channel field effect transistors and a pair of n-channel field effect transistors is disclosed. Elements of each fundamental cell are connected by lines, the fundamental cells are connected by lines, and a circuit is formed. The p-channel field effect transistors are formed in symmetry to each other, the n-channel field effect transistors are formed in symmetry to each other, one p-channel field effect transistor and one n-channel field effect transistor are formed in symmetry to each other, and the other p-channel field effect transistor and the other n-channel field effect transistor are formed in symmetry to each other. Also, a gate of each field effect transistor is formed in an H shape, and a line pitch between lines of a second layer is shorter than an arranging interval (or bulk pitch) between contact portions respectively connecting a line of a first layer and an element of the fundamental cell.

8 Claims, 10 Drawing Sheets

SEMICONDUCTOR INTEGRATED CIRCUIT DEVICE HAVING FUNDAMENTAL CELLS AND METHOD OF MANUFACTURING THE SEMICONDUCTOR INTEGRATED CIRCUIT DEVICE USING THE FUNDAMENTAL CELLS

BACKGROUND OF THE INVENTION

1. Field of the Invention

The present invention relates to a semiconductor integrated circuit device having fundamental cells such as a gate array or an embedded array type semiconductor integrated circuit device composed of a plurality of CMOS transistors and a method of manufacturing the semiconductor integrated circuit device using the fundamental cells.

2. Description of the Prior Art

A gate array or an embedded array type semiconductor integrated circuit device (or a large scaled integrated circuit LSI) in which a desired circuit is formed by connecting a plurality of fundamental cells respectively composed of a plurality of transistors or the like with each other through lines has been recently used. In this semiconductor integrated circuit device, it is required to heighten an integration degree of the transistors and improve the function of the device, elements of the semiconductor integrated circuit device such as a transistor have been downsized, and a distance between lines has been shortened.

FIG. 1(A) is a plan view of a fundamental cell of a conventional CMOS type gate array. In FIG. 1, 1 denotes a fundamental cell, the fundamental cell 1 is composed of a pair of p-channel field effect transistors TP1 and TP2 and a pair of n-channel field effect transistors TN1 and TN2. A large number of fundamental cells having the same configuration as that of the fundamental cell 1 are arranged on a semiconductor substrate in a lateral direction (or an X direction) and a longitudinal direction (or a Y direction).

The transistor TP1 is composed of a gate 2A formed on the semiconductor substrate through a gate insulating layer (not shown), and a pair of impurity diffused layers 3A and 4A formed on a pair of surfaces of the semiconductor substrate placed on both sides of the gate 2A. The gate 2A is made of a conductive material and is formed in a laid T shape. Also, a back gate 5A formed by diffusing impurities in a surface portion of the semiconductor substrate is arranged on one side (an upper side in FIG. 1A) of the impurity diffused layer 3A. The impurity diffused layers 3A and 4A function as a source and a drain of the transistor TP1.

The transistor TP2 is composed of a gate 6A formed on the semiconductor substrate through a gate insulating layer (not shown), and the impurity diffused layer 4A and an impurity diffused layer 7A formed on a pair of surfaces of the semiconductor substrate placed on both sides of the gate 6A. The gate 6A is formed in a T shape directed inversely to the gate 2A of the transistor TP1. The impurity diffused layers 4A and 7A function as a source and a drain of the transistor TP2. Also, a back gate 8A formed by diffusing impurities in a surface portion of the semiconductor substrate is arranged on one side (a lower side in FIG. 1A) of the impurity diffused layer 7A. In this case, the impurity diffused layer 4A is also an element of the transistor TP1.

The transistor TN1 is arranged at a position adjacent to the transistor TP1. The transistor TN1 is composed of a gate 2B formed on the semiconductor substrate through a gate insulating layer (not shown), and a pair of impurity diffused layers 3B and 4B formed on a pair of surfaces of the semiconductor substrate placed on both sides of the gate 2B. The gate 2B is formed in symmetry to the gate 2A of the transistor TP1. Also, a back gate 5B is formed on a surface of the semiconductor surface placed on one side (an upper side in FIG. 1A) of the impurity diffused layer 3B.

The transistor TN2 is arranged at a position adjacent to the transistor TP2. The transistor TN2 is composed of a gate 6B formed on the semiconductor substrate through a gate insulating layer (not shown), and the impurity diffused layer 4B and a impurity diffused layer 7B formed on a pair of surfaces of the semiconductor substrate placed on both sides of the gate 6B. The gate 6B is formed in symmetry to the gate 6A of the transistor TP2. Also, a back gate 8B is formed on a surface of the semiconductor surface placed on one side (a lower side in FIG. 1A) of the impurity diffused layer 7B.

In FIG. 1(A), a plurality of marks + respectively denote a wiring grid at which a line of a first layer (first wiring layer) formed on the fundamental cell 1 and a line of a second layer (second wiring layer) formed on the fundamental cell 1 cross over each other. The wiring grid is arranged on a central line of each of the impurity diffused layers 3A, 3B, 4A, 4B, 7A and 7B and the back gates 5A, 5B, 8A and 8B. The lines arranged on the fundamental cell 1 is designed by using a computer-aided design (CAD) system. That is, positions of the lines are determined in the CAD system to connect the wiring grids with each other through the lines.

For example, in the fundamental cell 1 shown in FIG. 1(A), a maximum of ten lines passing in the longitudinal directions (or the Y direction) can be formed as the lines of the first layer, and a maximum of five lines can passing in the lateral directions (or the X direction) can be formed as the lines of the second layer. In this case, a pitch between lines in the first layer is the same as that in the second layer.

FIG. 1(B) is a plan view showing a bulk pitch between candidates (respectively indicated by a symbol □) for each of positions at which contact portions for connecting the impurity diffused layers 3A, 3B, 4A, 4B, 7A and 7B and lines formed above the fundamental cell 1 are formed. In the CAD system, positions at which contact portions are actually formed are selected from the candidates for the positions according to a circuit to be formed. As shown in FIG. 1(B), each of the contact portions is formed at a grid crossing point.

FIG. 2 is a plan view of a two-input NAND circuit 9 formed by using the fundamental cell 1. In this case, five lines (from a first line to a fifth line) extending in the X direction are formed as the lines of the second layer (not shown) above the fundamental cell 1.

The gates 2A and 6A are connected with lines 31 and 32 of the first layer through the contact portions 41 and 42 and are connected with second and fourth lines (signal input lines) of the second layer through contact portions 56 and 57 for the lines of the first and second layers. Also, the gates 2A and 2B are connected with a line 34 through the contact portions 48 and 49, and the gates 6A and 6B are connected with a line 36 through contact portions 50 and 51.

The impurity diffused layers 3A and 7A and the back gates 5A and 8A are connected with a line 33 of the first layer through contact portions 43, 44, 45 and 46 and are connected with a fifth line (a power supply line) of the second layer through a contact portion 59. The impurity diffused layers 4A and 7B are connected with a line 35 through contact portions 47 and 52 and are connected with a third line (a signal output line) of the second layer through a contact portion 58. The impurity diffused layer 3B and the back gates 5B and 8B are connected with a line 37 through contact portions 53, 54 and 55 and are connected with a first line (a power supply line) of the second layer through a contact portion 60.

However, in the conventional semiconductor integrated circuit device described above, there are following drawbacks.

First, no excessive line is arranged above the fundamental cell. Therefore, in cases where a second fundamental cell and a third fundamental cell placed on both sides of a first fundamental cell are connected with each other through a line, it is required that the line takes a long way around the first fundamental cell. Therefore, the line is lengthened, and there is a probability that the degradation of a signal transmitting through the line occurs and a noise occurs in the signal.

Secondly, in cases where a line of the first layer and a line of the second layer are connected with each other, it is required to use two wiring grids. FIGS. 3(A) and 3(B) are respectively a cross-sectional view showing the connection between the gate 2A and a line 95 of the second layer. In FIGS. 3(A) and 3(B), 91 denotes an insulating layer arranged between a line of the first layer and a line of the second layer. Also, 31A denotes a connecting element arranged to prevent a disconnection of a line caused by a change of a positional difference between the contact portions 41 and 56. As shown in FIG. 3(A), in cases where the gate 2A is connected with the line 95 of the second layer, assuming that the contact portion 56 connecting the line of the first layer and the line of the second layer is formed on the contact portion 41 connecting the fundamental cell and the line of the first layer, a height of a projecting portion of the insulating layer 92 increases, and a disconnection of a line formed on the insulating layer 92 easily occurs. Therefore, as shown in FIG. 3(B), positions of the contact portions 41 and 56 are determined not to place the contact portion 56 connecting the line of the first layer and the line of the second layer above the contact portion 41 connecting the fundamental cell and the line of the first layer.

Thirdly, in cases where a region on one fundamental cell is used as a connecting region (or a wiring channel) in which other fundamental cells are connected each other, a transistor utilizing rate $\alpha/(\alpha+\beta)$ in an LSI chip is lowered. Here, $\alpha$ denotes the number of all fundamental cells, and $\beta$ denotes the number of fundamental cells used as wiring channels.

FIG. 4 is an explanatory view of an example of a transistor utilizing rate in the conventional semiconductor integrated circuit device. In FIG. 4, 10A denotes a group of fundamental cells used as an output transistor circuit, and the output transistor circuit is composed of five fundamental cells 1. Five signals are, for example, output from each fundamental cell of the transistor circuit 10A. 10B denotes a group of fundamental cells used as an input transistor circuit, and the input transistor circuit is composed of five fundamental cells 1. Four signals are, for example, input to each fundamental cell of the transistor circuit 10B. 10C denotes a group of fundamental cells used as a wiring channel. Here, three lines except two power supply lines can pass through each of the fundamental cells 10A, 10B and 10C.

In cases where twenty lines connect the group of fundamental cells 10A and the group of fundamental cells 10B, seven fundamental cells (3*6+2) are required as the wiring channel. In this case, a transistor utilizing rate is low because the transistor utilizing rate is about 51% (10/17*100≅51).

SUMMARY OF THE INVENTION

An object of the present invention is to provide, with due consideration to the drawbacks of such a conventional semiconductor integrated circuit device, a semiconductor integrated circuit device in which the number of lines formed above each of fundamental cells is increased and a utilizing rate of the fundamental cells is improved and a method of manufacturing the semiconductor integrated circuit device using the fundamental cells.

In the present invention, a line pitch between lines arranged above a fundamental cell of a semiconductor substrate is set to be smaller than an arranging pitch between contact portions connected with the fundamental cell. It is required to set the arranging pitch (or a bulk pitch) between contact portions to a value longer than a minimum arranging pitch between patterns determined according to a lithography by considering an error in the arrangement of an impurity diffused layer or a gate arranged on a surface of the semiconductor substrate. In contrast, the line pitch can be shortened to the minimum arranging pitch between patterns determined according to the lithography. Therefore, the line pitch is set to be smaller than the bulk pitch in the present invention. Therefore, the number of lines arranged on each of fundamental cells can be increases as compared with that in the convention art, and a utilizing rate of the fundamental cells can be improved.

Also, each of fundamental cells in a CMOS type gate array generally comprises a pair of p-channel field effect transistors and a pair of n-channel field effect transistors. In this type of fundamental cell, when a gate of each of transistors is formed in an H shape, the number of candidates for a position of a contact portion connected with the gate is increased, and the number of design degrees of freedom is increased.

Also, the p-channel field effect transistors are arranged in symmetry to each other with respect to a line, the n-channel field effect transistors are arranged in symmetry to each other with respect to a line, and each of the p-channel field effect transistors is arranged in symmetry to one corresponding n-channel field effect transistor with respect to a line. Therefore, the number of degrees of freedom in a wiring design for a circuit formation is increased.

Also, an interval between a group of the p-channel field effect transistors and a group of the n-channel field effect transistors is widened. Therefore, an interval between lines connected with a gate of each transistor can be widened, and the occurrence of a crosstalk can be prevented.

DESCRIPTION OF THE PREFERRED EMBODIMENTS

Preferred embodiments of a semiconductor integrated circuit device having fundamental cells and a method of manufacturing the semiconductor integrated circuit device using the fundamental cells according to the present invention are described with reference to FIG. 5 to FIG. 8.

Figure 1A:
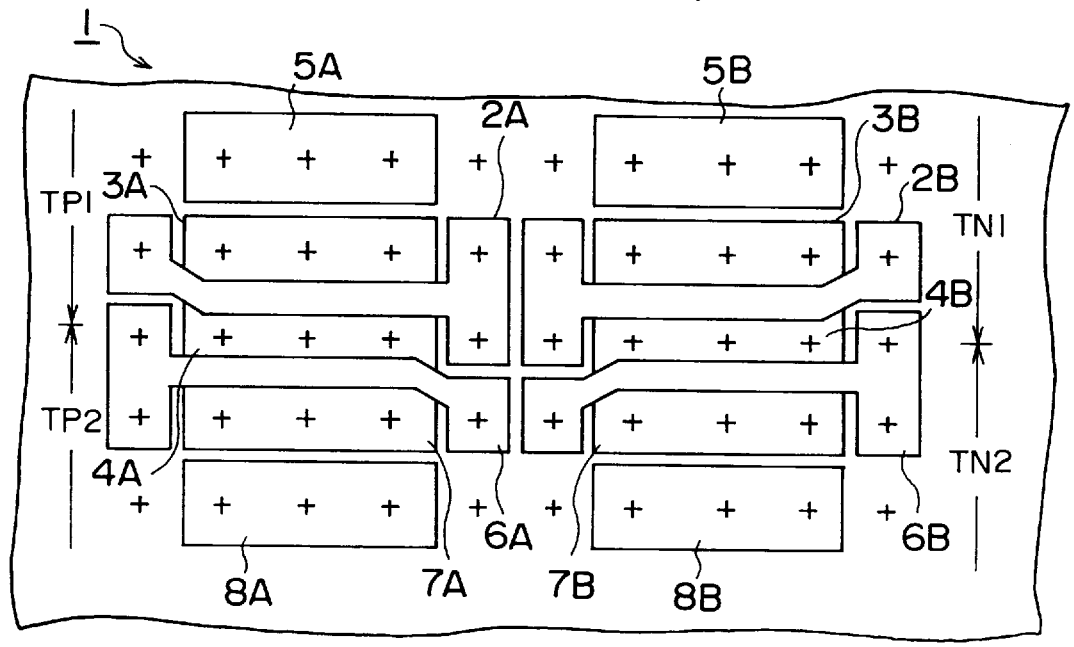
FIG. 1(A) is a plan view showing a fundamental cell of a conventional CMOS type gate array.
Figure 1B:
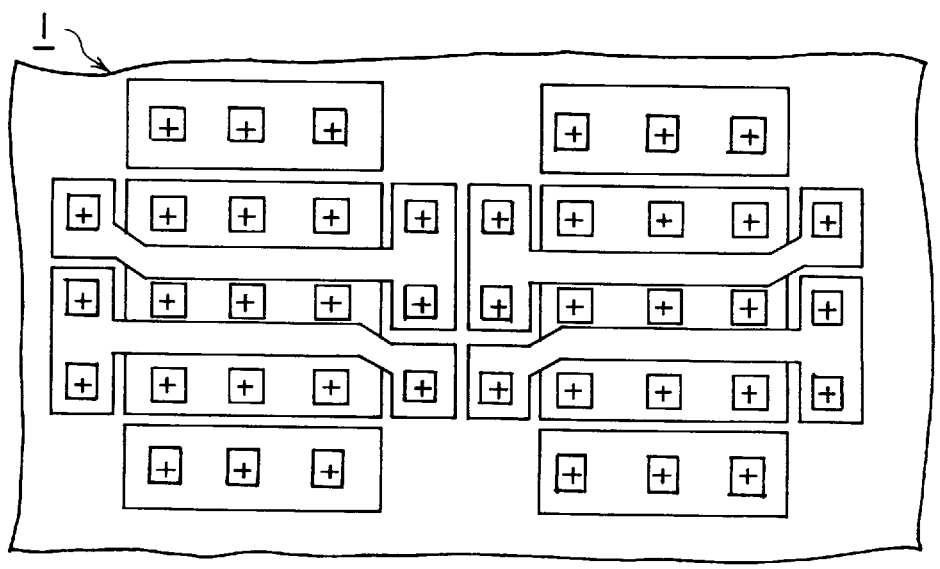
FIG. 1(B) is a plan view showing an arranging pitch (or a bulk pitch) between candidates for each of positions at which contact portions of the fundamental cell are formed.
Figure 2:
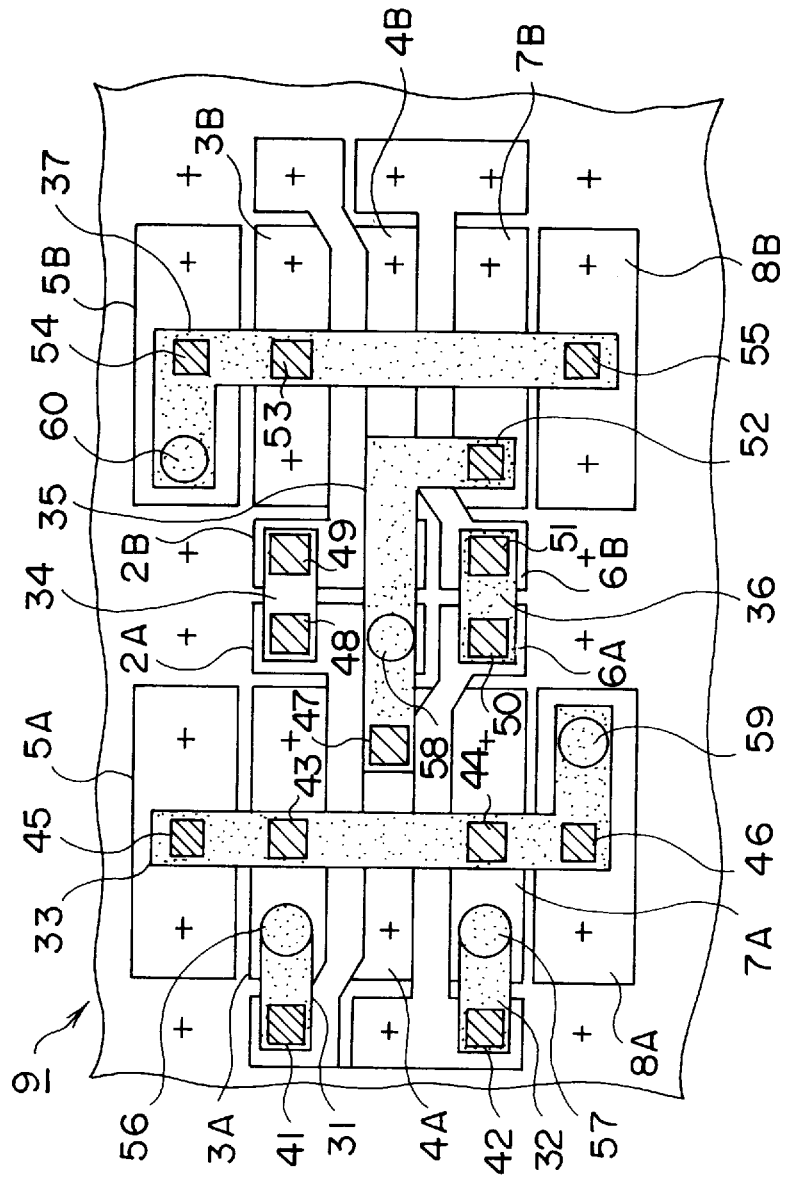
FIG. 2 is a plan view of a two-input NAND circuit formed by using the fundamental cell.
Figure 3A:
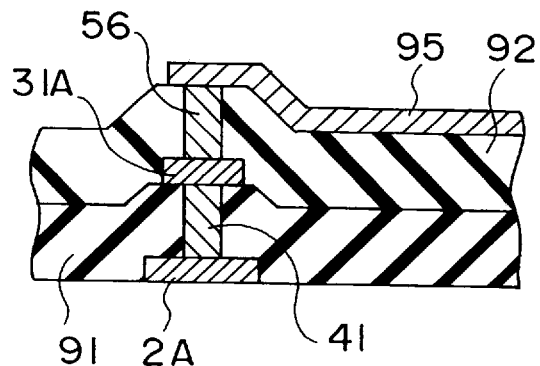
FIG. 3(A) is a cross-sectional view showing a drawback occurring when a pair of contact portions are piled up.
Figure 3B:
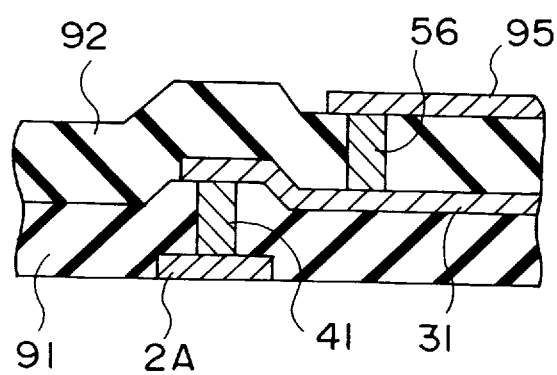
FIG. 3(B) is a cross-sectional view showing a connecting portion for a pair of contact portions which are not piled up.
Figure 4:
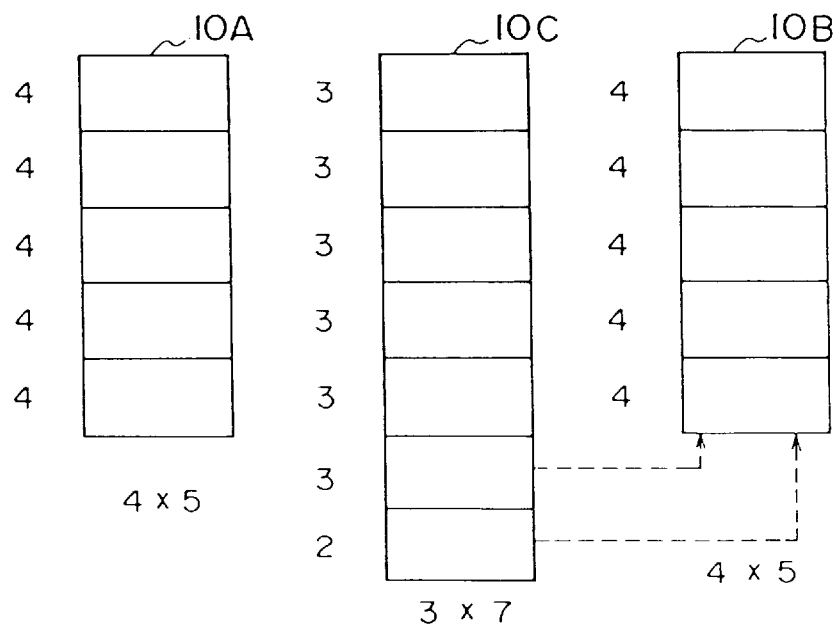
FIG. 4 is an explanatory view of an example of a transistor utilizing rate in a conventional semiconductor integrated circuit device.
Figure 5:
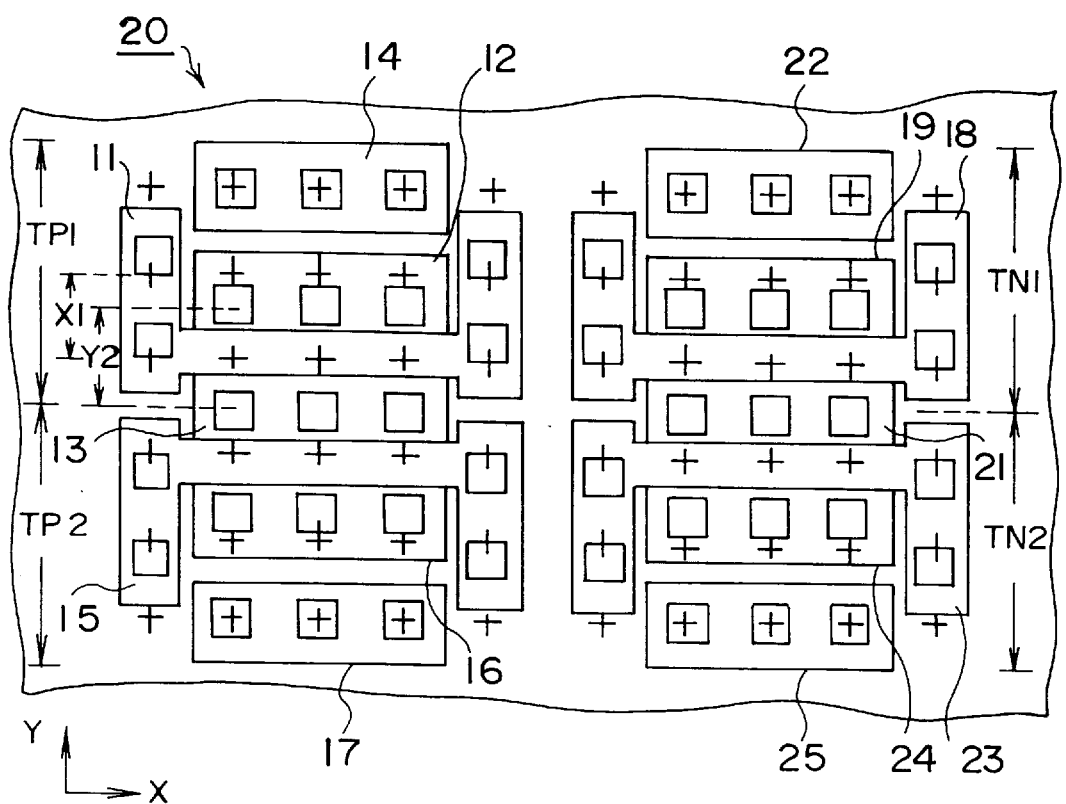
FIG. 5 is a plan view showing a fundamental cell of a CMOS type array according to an embodiment of the present invention.

FIG. 5 is a plan view showing a fundamental cell of a CMOS type array (a semiconductor integrated circuit device) according to an embodiment of the present invention.

A fundamental cell 20 comprises a pair of p-channel field effect transistors TP1 and TP2 and a pair of n-channel field effect transistors TN1 and TN2.

The transistor TP1 comprises a gate 11 arranged on a semiconductor substrate through a gate insulating layer (not shown), a pair of impurity diffusing layers 12 and 13 arranged on a pair of surfaces of the semiconductor substrate placed on both sides of the gate 11, and a back gate 14 arranged on one side (an upper side in FIG. 5) of the impurity diffusing layer 12. The gate 11 of the transistor TP1 is formed in H shape. Also, the impurity diffusing layers 12 and 13 function as a source and a drain.

The transistor TP2 comprises a gate 15 arranged on the semiconductor substrate through a gate insulating layer (not shown), the impurity diffusing layer 13 and an impurity diffusing layer 16 arranged on a pair of surfaces of the semiconductor substrate placed on both sides of the gate 15, and a back gate 17 formed by diffusing impurities in a surface portion of the semiconductor substrate placed on one side of the impurity diffused layer 16. The impurity diffusing layer 13 is a composing element of the transistor TP1, and the transistors TP1 and TP2 are arranged in symmetry (mirror symmetry) to each other with respect to a central line of the impurity diffusing layer 13.

The transistor TN1 comprises a gate 18 arranged on a semiconductor substrate through a gate insulating layer (not shown), a pair of impurity diffusing layers 19 and 21 arranged on a pair of surfaces of the semiconductor substrate placed on both sides of the gate 18, and a back gate 22 formed by diffusing impurities in a surface portion of the semiconductor substrate placed on one side (an upper side in FIG. 5) of the impurity diffused layer 19.

The transistor TN2 comprises a gate 23 arranged on the semiconductor substrate through a gate insulating layer (not shown), the impurity diffusing layer 21 and an impurity diffusing layer 24 arranged on a pair of surfaces of the semiconductor substrate placed on both sides of the gate 23, and a back gate 25 formed by diffusing impurities in a surface portion of the semiconductor substrate placed on one side (a lower side in FIG. 5) of the impurity diffused layer 24. The transistors TN1 and TN2 are arranged in symmetry (mirror symmetry) to each other with respect to a central line of the impurity diffusing layer 24.

The transistor TN1 is arranged at a position adjacent to the transistor TP1, and the transistors TN1 and TP1 are arranged in symmetry to each other with respect to a central line between the transistors TN1 and TP1. Also, the transistor TN2 is arranged at a position adjacent to the transistor TP2, and the transistors TN2 and TP2 are arranged in symmetry (mirror symmetry) to each other with respect to a central line between the transistors TN2 and TP2.

In FIG. 5, each of marks + denotes a wiring grid at which a line of a first layer placed on the fundamental cell 20 and a line of a second layer placed on the first layer cross over each other. In this embodiment, a maximum of ten lines extending in a longitudinal directions (or a Y direction) can be formed for each fundamental cell, and a maximum of six lines extending in a lateral direction (or an X direction) can be formed for each fundamental cell. In this case, a pitch between lines in the first layer is the same as that in the second layer.

In FIG. 5, a symbol □ denotes a candidate for a position at which a contact portion connecting a fundamental cell and a line of the first layer is formed. In this embodiment, three candidates for a contact portion forming position are arranged on each of the impurity diffused layers 12, 13, 16, 19, 21 and 24 and are arranged on each of the back gates 14, 17, 22 and 25. Also, four candidates for a contact portion forming position are arranged on each of the gates 11, 15, 18 and 23 of the transistors TP1, TP2, TN1 and TN2. The candidates for a contact portion forming position arranged on each of the impurity diffused layers 12, 13, 16, 19, 21 and 24 are placed at positions off the corresponding wiring grids. The candidates for a contact portion forming position arranged on each of the back gates 14, 17, 22 and 25 are placed at the same positions as those of the corresponding wiring grids. The candidates for a contact portion forming position arranged on each of the gates 11, 15, 18 and 23 are placed at positions slightly off the corresponding wiring grids.

In the CAD system, when a circuit is designed, a particular position at which a contact portion is actually formed is selected from a plurality of candidates for the particular position, and a pattern of a line connecting one contact portion and another contact portion is designed.

Figure 6:
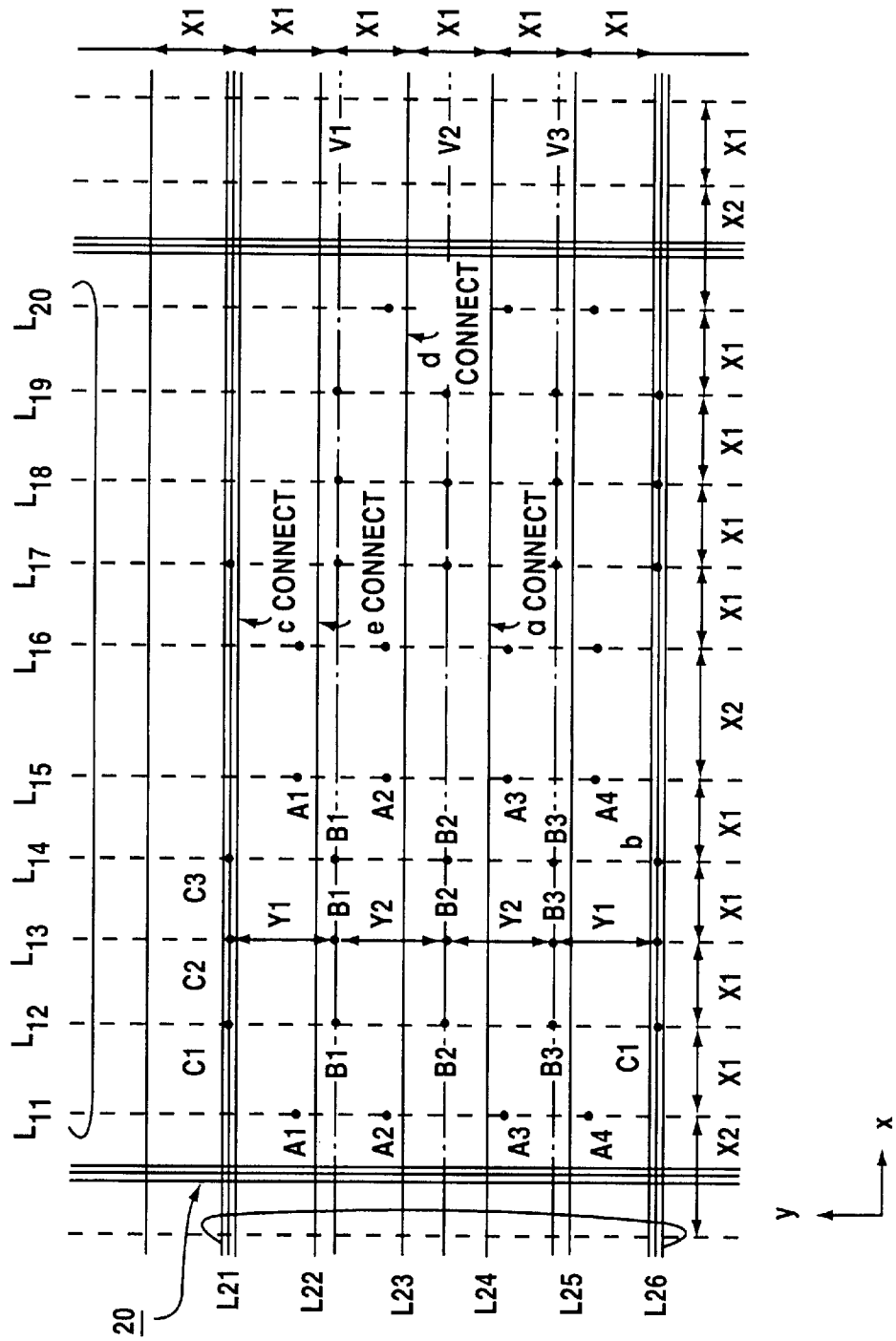
FIG. 6 is a view showing a relationship between a line pitch between fundamental cells of a semiconductor integrated circuit device according to the embodiment of the present invention and an arranging interval between contact portions of the semiconductor integrated circuit device.

Next, an arranging interval between a line and a contact portion is described. FIG. 6 is a view showing a relationship between a line pitch between fundamental cells of a semiconductor integrated circuit device according to the embodiment of the present invention and an arranging interval between contact portions of the semiconductor integrated circuit device.

In FIG. 6, a rectangular portion surrounded by a triple line indicates a fundamental cell forming region. The fundamental cell 20 is arranged in this rectangular region. Symbols L11 to L20 indicated by broken lines in FIG. 6 denote lines of the first layer of the fundamental cell 20, and symbols L21 to L26 indicated by dashed lines in FIG. 6 denote lines of the second layer of the fundamental cell 20. A line L11 of the first layer is arranged along a central line of one side portions (left side portions in FIG. 5) of the gates 11 and 15 extending in the Y direction, a line L15 of the first layer is arranged along a central line of the other side portions (right side portions in FIG. 5) of the gates 11 and 15 extending in the Y direction, lines L12 to L14 of the first layer are arranged between the lines L11 and L15 to equally divide a region between the lines L11 and L15 into four sub-regions. In the same manner, a line L16 of the first layer is arranged along a central line of one side portions (left side portions in FIG. 5) of the gates 18 and 23 extending in the Y direction, a line L20 of the first layer is arranged along a central line of the other side portions (right side portions in FIG. 5) of the gates 18 and 23 extending in the Y direction, lines L17 to L19 of the first layer are arranged between the lines L16 and L20 to equally divide a region between the lines L16 and L20 into four sub-regions.

Also, a line L21 of the second layer is arranged along a central line of the back gates 14 and 22 extending in the X direction, a line L26 of the second layer is arranged along a central line of the back gates 17 and 25 extending in the X direction, lines L22 to L25 of the second layer are arranged between the lines L21 and L26 to equally divide a region between the lines L21 and L26 into five sub-regions. Line pitches among the lines L11 to L15 of the first layer, line pitches among the lines L16 to L20 of the first layer and line pitches among the lines L21 to L26 of the second layer are respectively set to a value X1, a line pitch between the lines L15 and L16 of the first layer and a line pitch between the line L11 of the fundamental cell 20 and a line L20 of another fundamental cell adjacent to the fundamental cell 20 are respectively set to a value X2 (X1<X2). For example, the line pitch X1 is set to 1.25 μm, and the line pitch X2 is set to 1.45 μm.

Symbols A1 to A4 respectively indicated by a dot in FIG. 6 denote central points of the contact portions of the gates 11 and 15 of the transistors TP1 and TP2. In the same manner, symbols B1 to B3 respectively indicated by a dot denote central points of the contact portions of the impurity diffused layers 12, 13 and 16 (which function as a source or a drain) of the transistors TP1 and TP2, and symbols C1 to C3 respectively indicated by a dot denote central points of the contact portions of the back gates 14 and 17 of the transistors TP1 and TP2.

Central points B1 are arranged to form a straight line, which is referred to as a first virtual line V1. In the same manner, central points B2 and B3 are arranged respectively to form straight lines, which are referred to as a second and a third virtual lines V2 and V3. In this case, the first, second, and third virtual lines V1, V2 and V3 are arranged in parallel with each other and, further, in parallel with the lines L21 to L26. As shown in this figure, the distances between the virtual lines V1 and V2, and the virtual lines V2 and V3 are equal to each other.

In FIG. 6, symbol Y1 denotes the distance between the central points B1 on the impurity diffused layer 12 and the central point C1 (C2 or C3) on the back gate 14. It also denotes the distance between the central points B3 on the impurity diffused layer 16 and the central point C on the back gate 17. In addition, symbol Y2 denotes the bulk pitches of the impurity diffused layers 12, 13 and 16 or the impurity diffused layers 19, 21 and 24. In fact, the symbol Y2 denotes the distance among the first, second and third virtual lines V1, V2 and V3, as shown in FIG. 6.

The pitches Y1 and Y2 satisfy a relationship Y1≧Y2. Also, the bulk pitch Y2 and the line pitch X1 satisfy a relationship X1<Y2.

In FIG. 6, symbols a to e denote arranging positions of the contact portions connecting lines of the first layer and lines of the second layer as an example. A contact portion arranged at the position a is the contact portion connected with an upper surface of the gate 23 of the transistor TN2, and the contact portion arranged at the position a is, for example, connected with the line 24 of the second layer. A contact portion arranged at the position b is the contact portion connected with the back gate 17 of the transistor TP2, and the contact portion arranged at the position b is, for example, connected with the electric source line (or the line L26) of the second layer. A contact portion arranged at the position c is the contact portion connected with the back gate 22 of the transistor TN1, and the contact portion arranged at the position c is, for example, connected with the power supply line (or the line L21) of the second layer. A contact portion arranged at the position d is the contact portion connected with the impurity diffused layer 21, and the contact portion arranged at the position d is, for example, connected with the line L23 of the second layer. A contact portion arranged at the position e is the contact portion connected with the impurity diffused layer 19, and the contact portion arranged at the position e is, for example, connected with the line L22 of the second layer. Therefore, the lines L21, L22, L23, L24 and L26 are used, and the line L25 remains as an unused channel.

Next, a method of manufacturing the conventional semiconductor integrated circuit device in which the fundamental cell 20 described above is used is described. Hereinafter, the formation of a two-input NAND circuit using the fundamental cell 20 is described.

Figure 7:
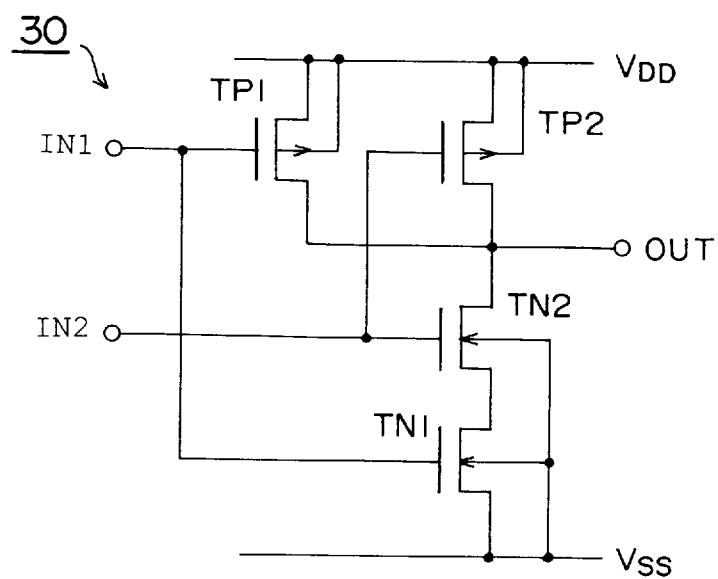
FIG. 7 is a circuit view showing a two-input NAND circuit.

FIG. 7 is a circuit view showing a two-input NAND circuit 30 comprising a pair of p-channel MOS transistors TP1 and TP2 and a pair of n-channel MOS transistors TN1 and TN2. In this two-input NAND circuit, a first input signal IN1 is input to gates of the transistors TP1 and TN1, and a second input signal IN2 is input to gates of the transistors TP2 and TN2. Also, an output signal OUT is output from a connecting point at which drains of the transistors TP1, TP2 and TN2 are connected with each other.

Figure 8A:
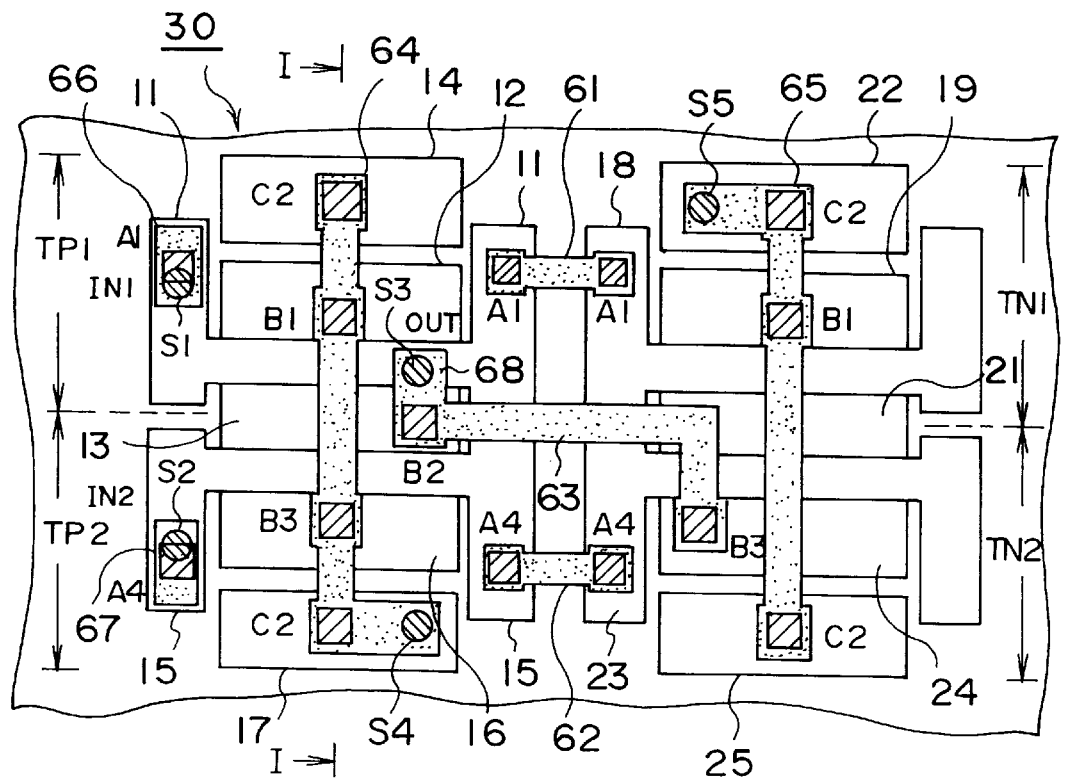
FIG. 8(A) is a plan view showing a two-input NAND circuit formed by using a fundamental cell.
Figure 8B:
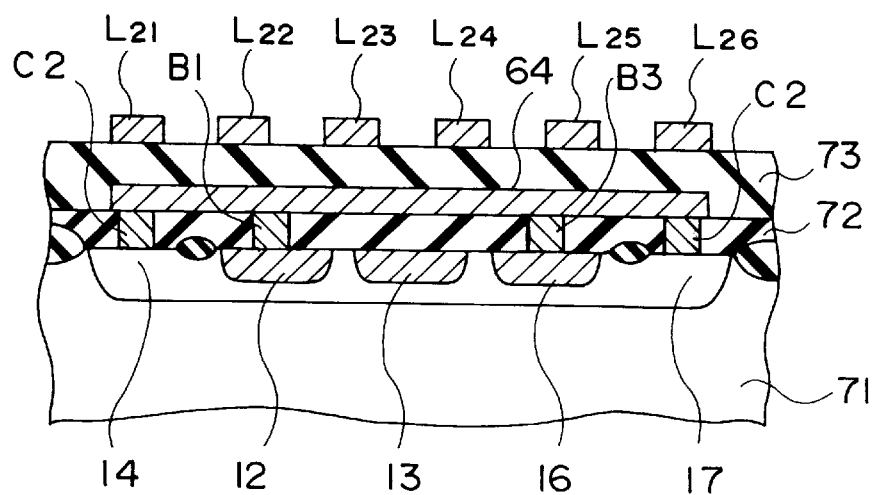
FIG. 8(B) is a cross-sectional view taken generally along a line I—I of FIG. 8(A)

FIG. 8(A) is a plan view showing a two-input NAND circuit formed by using a fundamental cell, and FIG. 8(B) is a cross-sectional view taken generally along a line I—I of FIG. 8(A). In FIG. 8(B), 71 denotes a semiconductor substrate, 72 denotes a first insulating layer arranged between a fundamental cell and a line of the first layer, 73 denotes a second insulating layer arranged between a line of the first layer and a line of the second layer.

Each of particular positions at which a plurality of contact portions are actually formed is initially selected from a plurality of candidates for each particular position, and a plurality of contact portions A1, A4, B1, B2, B3 and C2 are formed in the insulating layer 72.

Thereafter, a plurality of lines 61 to 67 of a first layer are formed on the insulating layer 72. In this case, a contact portion A1 arranged on the gate 11 of the transistor TP1 and a contact portion A1 arranged on the gate 18 of the transistor TN1 are connected by the line 61 of the first layer, and a contact portion A4 arranged on the gate 15 of the transistor TP2 and a contact portion A4 arranged on the gate 23 of the transistor TN2 are connected by the line 62 of the first layer. Also, a contact portion B2 arranged on the impurity diffused layer 13 and a contact portion B3 arranged on the impurity diffused layer 24 are connected by the line 63 of the first layer, and a contact portion B1 arranged on the impurity diffused layer 12, a contact portion B3 arranged on the impurity diffused layer 16 and a pair of contact portions C2 arranged on the back gates 14 and 17 are connected by the line 64 of the first layer. Also, a contact portion B1 arranged on the impurity diffused layer 19 and a pair of contact portions C2 arranged on the back gates 22 and 15 are connected by the line 65 of the first layer. Therefore, three lines (the lines L12, L19 and L20 shown in FIG. 6) not connected with the fundamental cell as the lines of the first layer remain.

Thereafter, the insulating layer 73 is formed on the lines 61 to 67 of the first layer, and a plurality of contact portions S1 to S5 are formed in the insulating layer 73. The contact portion (or a stud-via) S1 is connected with the line 66 of the first layer which is connected with the contact portion A1 placed on the gate 11 of the transistor TP1, the contact portion (or a stud-via) S2 is connected with the line 67 of the first layer which is connected with the contact portion A4 placed on the gate 15 of the transistor TP2, the contact portion S3 is connected with the line 63 which is connected with the contact portion B2 placed on the impurity diffused layer 13, the contact portion S4 is connected with the line 64 of the first layer which is connected with the contact portions B1, B3 and C2 placed on the impurity diffused layers 12 and 16 and the back gates 14 and 17, and the contact portion S5 is connected with the line 65 of the first layer which is connected with the contact portions B1 and C2 placed on the impurity diffused layer 19 and the back gates 22 and 25.

Thereafter, a plurality of lines (the lines L21 to L26 shown in FIG. 6) are formed on the insulating layer 73. In this case, the line L21 is connected with the contact portion S5 and functions as a power supply line. The line L22 is connected with the contact portion S4, and the first input signal IN1 passes through the line L22. The line L23 is connected with the contact portion S3, and the output signal OUT passes through the line L23. The line L25 is connected with the contact portion S2, and the second input signal IN2 passes through the line L25. The line L26 is connected with the contact portion S1 and functions as an electric source line. In this embodiment, the line L24 of the second layer is not connected with the fundamental cell. Therefore, the line L24 of the second layer can be used as a line connecting a pair of other fundamental cells.

Figure 9:
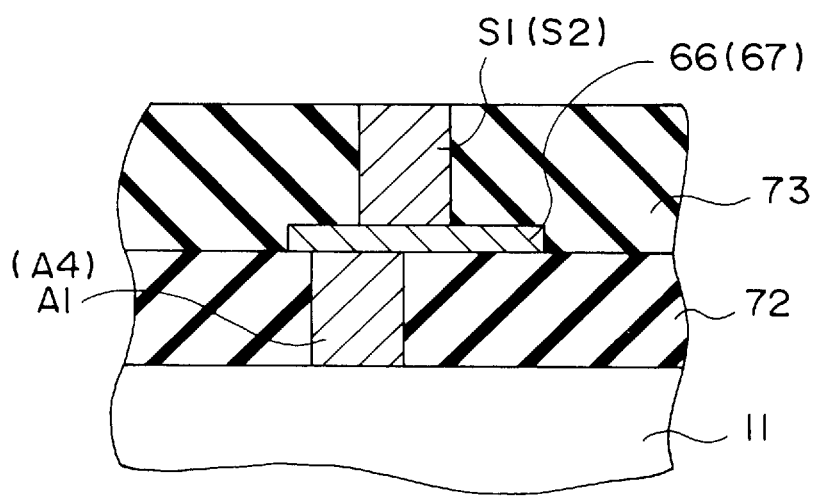
FIG. 9 is a cross-sectional view showing a structure of a stud-via.

As shown in FIG. 9, the contact portions (or stud-via) S1 and S2 are formed on condition that an upper contact portion is piled up on a lower contact portion. Here, a stud-via denotes a portion in which an upper contact portion is connected with a lower contact portion on condition that a portion of the upper contact portion is piled up on a portion of the lower contact portion. After the insulating layer 73 is formed, a flattening operation is performed for the insulating layer 73 to flatten a surface of the insulating layer 73, a contact hole is formed in the insulating layer 73, a conductive material is buried in the contact hole. As a result, the contact portions S1 to S5 made of the conduct material are formed in the insulating layer 73. Therefore, the disconnection of one or more lines of the second layer formed on the insulating layer 73 can be prevented.

Figure 10:
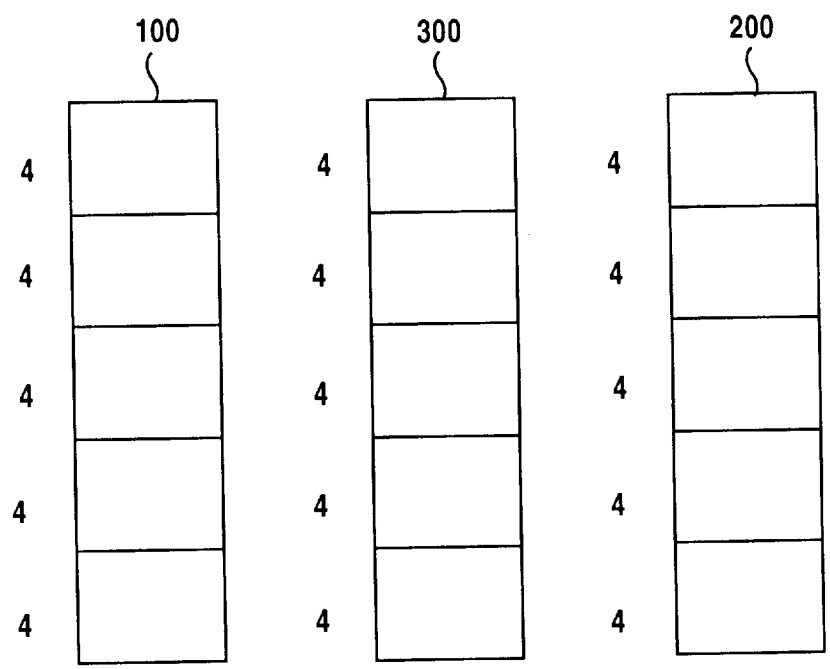
FIG. 10 is a view showing a transistor utilizing rate according to the embodiment of the present invention.

Next, a transistor utilizing rate is described on condition that the fundamental cell 20 is used as a line channel. FIG. 10 is an explanatory view of a transistor utilizing rate in cases where the fundamental cell according to the embodiment of the present invention is used.

In FIG. 10, 100 denotes a group of fundamental cells used as an output transistor circuit, and the output transistor circuit 100 is composed of five fundamental cells 20. Twenty signals (4*5) are, for example, output from the output transistor circuit 100. 200 denotes a group of fundamental cells used as an input transistor circuit, and the input transistor circuit 200 is composed of five fundamental cells 20. Twenty signals (4*5) are, for example, input to the input transistor circuit 200. 300 denotes a group of fundamental cells used as a line channel.

In this embodiment, because four lines of the second layer (except two power supply lines) can be used as signal lines, in cases where a group of twenty output lines of the group of fundamental cells 100 and a group of twenty input lines of the group of fundamental cells 200 are connected by the group of fundamental cells 300, the number of fundamental cells 20 required to be arranged between the group of fundamental cells 100 and the group of fundamental cells 200 is no more than five (4 lines * 5). That is, the number of fundamental cells used as a line channel can be reduced by two as compared with that in the conventional semiconductor integrated circuit device. Therefore, a transistor utilizing rate is considerably heightened to 66.6% (10/15*100≅66.6).

In cases where a line pitch between lines on the fundamental cell is moreover shortened, the transistor utilizing rate can be moreover improved.

In this embodiment, because an area occupied by the lines can be reduced, an LSI chip can be downsized, and a semiconductor integrated circuit in which elements are arranged in a higher integrated degree can be manufactured at a lower cost.

Also, in this embodiment, because the transistors TP1 and TP2 are formed in symmetry to each other, the transistors TN1 and TN2 are formed in symmetry to each other and a group of the transistors TP1 and TP2 and a group of the transistors TN1 and TN2 are formed in symmetry to each other, a wiring degree of freedom can be heightened.

Also, in this embodiment, because the number of lines capable to be formed on the fundamental cell is high and because it is not required that a line connecting the group of fundamental cells 100 and the group of fundamental cells 200 takes a long way around the group of fundamental cells 300, a length of each line in the semiconductor integrated circuit can be shortened, and an electric power consumed in the semiconductor integrated circuit can be reduced.

Also, in this embodiment, because a distance between a group of the transistors TP1 and TP2 and a group of the transistors TN1 and TN2 is set to the value X2 higher than the line pitch X1, a dielectric strength between the gates can be heightened, and the occurrence of a crosstalk can be suppressed.

Also, in this embodiment, in cases where a region placed on the fundamental cell is used as a region in which one or more lines connecting other fundamental cells are arranged, the number of lines connecting two fundamental cells can be increased, and a utilizing efficiency for the fundamental cell can be enhanced.

Also, in this embodiment, because a contact portion connecting a fundamental cell and a line of a first layer and another contact portion connecting the line of the first layer and a line of a second layer are piled up each other in a vertical direction, a utilizing rate for the line grid can be lessened, and a degree of freedom in a design of a wiring pattern can be enhanced.

What is claimed is:

1. A semiconductor integrated circuit including:
   a plurality of fundamental cells each made up of a plurality of elements formed on a semiconductor substrate:
   a first line accommodation layer having line channels for accommodating a first group of lines running in X direction, said first line accommodation layer being formed adjacent to said plurality of fundamental cells in the direction of the thickness of said cells;
   a second line accommodation layer having lines channels for accommodating a second group of lines running in Y direction, said second line accommodation layer being formed adjacent to said first layer in the direction of the thickness of said first layer in the direction of the thickness of said first layer;

contact portions formed on said elements, one for each of said elements, wherein one of said first and second line accommodation layers increases the number of line channels to make up for a deficiency of the number of line channels, the other one of said line accommodation layers changes a pitch for said line channels associated therewith, and wherein each of said contact portions is connected to a nearest neighboring one of said lines.

2. A semiconductor integrated circuit device according to claim 1 in which each of the plurality of elements comprises one of a p-channel field effect transistor and an n-channel field effect transistor and the fundamental cell comprises a first and a second p-channel field effect transistors and a first and a second n-channel field effect transistors.

3. A semiconductor integrated circuit device according to claim 2 in which the first p-channel and n-channel field effect transistors are arranged to form a mirror symmetry with the second p-channel and n-channel field effect transistors and, at the same time, the first and the second p-channel field effect transistors are arranged to form another mirror symmetry with the first and second n-channel field effect transistors.

4. A semiconductor integrated circuit device according to claim 3 in which a gate of the first and the second p-channel field effect transistors and the first and second n-channel field effect transistors is formed in an H shape.

5. A semiconductor integrated circuit device according to claim 3 in which the lines of the first group are arranged at positions which equally divide a region between a central line of a back gate of one of the p-channel field effect transistors or the n-channel field effect transistors and a central line of a back gate of the other p-channel field effect transistor or the other n-channel field effect transistor.

6. A semiconductor integrated circuit device according to claim 1, wherein each of the lines of the second group is substantially perpendicular to the lines of the first group.

7. A semiconductor integrated circuit device according to claim 5 in which a distance between one line of the second group nearest to the n-channel field effect transistors among a plurality of lines of the second group arranged above the p-channel field effect transistors and another line of the second group nearest to the p-channel field effect transistors among a plurality of lines of the second group arranged above the n-channel field effect transistors is larger than a pitch between the lines of the first group.

8. A semiconductor integrated circuit device according to claim 1 in which one or more lines of the first group are not connected with any of the elements of the fundamental cell and are arranged above the fundamental cell.

* * * * *